(12) United States Patent
Kaneko

(10) Patent No.: US 7,679,907 B2
(45) Date of Patent: Mar. 16, 2010

(54) ELECTRONIC APPARATUS AND FIN UNIT

(75) Inventor: Takeyoshi Kaneko, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 12/016,543

(22) Filed: Jan. 18, 2008

(65) Prior Publication Data

US 2008/0180913 A1 Jul. 31, 2008

(30) Foreign Application Priority Data

Jan. 31, 2007 (JP) ............... 2007-021196

(51) Int. Cl.
*H05K 7/20* (2006.01)
(52) U.S. Cl. .............. 361/695; 361/698; 361/700; 165/80.3; 165/80.4; 165/104.33; 174/15.1; 174/15.2; 174/16.3
(58) Field of Classification Search ......... 361/695–700; 165/80.3, 80.4
See application file for complete search history.

(56) References Cited

U.S. PATENT DOCUMENTS

| 6,778,390 | B2 * | 8/2004 | Michael .................. 361/695 |
| 6,900,990 | B2 * | 5/2005 | Tomioka .................. 361/752 |
| 7,079,394 | B2 | 7/2006 | Mok |
| 7,212,404 | B2 * | 5/2007 | Wang et al. ............... 361/697 |
| 7,248,473 | B2 * | 7/2007 | Ohnishi et al. ............ 361/695 |
| 7,333,332 | B2 * | 2/2008 | Wang ........................ 361/700 |
| 7,345,874 | B2 * | 3/2008 | Cheng et al. ............... 361/695 |
| 7,405,930 | B2 * | 7/2008 | Hongo et al. ............ 361/679.48 |
| 7,414,850 | B2 * | 8/2008 | Hung ........................ 361/719 |
| 7,466,548 | B2 * | 12/2008 | Ishikawa .................. 361/698 |
| 2004/0001316 | A1 * | 1/2004 | Kamikawa et al. ........ 361/700 |
| 2008/0043436 | A1 * | 2/2008 | Hung et al. ................ 361/700 |
| 2008/0105410 | A1 * | 5/2008 | Hwang et al. ............ 165/104.33 |

FOREIGN PATENT DOCUMENTS

| CN | 2739930 Y | 11/2005 |
| JP | 2004-104148 | 4/2004 |
| JP | 2005-243925 | 9/2005 |
| JP | 2006-147618 | 6/2006 |

OTHER PUBLICATIONS

Chinese Patent No. 2008100090623 First Office Action mailed Dec. 1, 2009 (English Translation).

* cited by examiner

*Primary Examiner*—Boris L Chervinsky
(74) *Attorney, Agent, or Firm*—Blakely, Sokoloff, Taylor & Zafman LLP

(57) ABSTRACT

According to one embodiment, an electronic apparatus includes a housing, a heat-generating element mounted in the housing, a cooling fan mounted in the housing, a fin unit which is mounted in the housing and opposed to the cooling fan, and a heat transfer member which thermally connects the fin unit to the heat-generating element. The cooling fan includes a fan case which is provided with an opening portion. The fin unit includes an insertion portion which is inserted into the fan case through the opening portion. The insertion portion is provided to extend from one longitudinal end area to the other longitudinal end area of the opening portion.

16 Claims, 6 Drawing Sheets

ELECTRONIC APPARATUS AND FIN UNIT

CROSS-REFERENCE TO RELATED APPLICATIONS

This application is based upon and claims the benefit of priority from Japanese Patent Application No. 2007-021196, filed Jan. 31, 2007, the entire contents of which are incorporated herein by reference.

BACKGROUND

1. Field

One embodiment of the present invention relates to a heat radiator and an electronic apparatus provided with the radiator.

2. Description of the Related Art

Electronic apparatuses such as portable computers are equipped with a heat-generating element such as a CPU or a north bridge (trademark), and a cooling unit for cooling the heat-generating element. An example of such a cooling unit includes a cooling fan, a fin unit, and a heat pipe.

Jpn. Pat. Appln. KOKAI Pub. No. 2006-147618 discloses a cooling unit including a cooling fan and a fin unit. The cooling fan has a case in which an air outlet is opened. The fin unit has a plurality of fins arranged in the air outlet of the cooling fan. The fin unit is configured such that the lengths of the fins become gradually larger from a region in which the discharged air has low air velocity toward a region in which the discharged air has high air velocity.

Recent electronic apparatuses are required to have further reduced size and low price. On the other hand, heat-generating elements provided to the electronic apparatuses are expected to have higher temperature. Therefore, it is required to provide electronic apparatuses having an improved cooling performance, without a large mounting space.

In the fin unit disclosed in the above patent document, the lengths of the fins are adjusted according to the air velocity of the discharged air of the cooling fan. Specifically, it is necessary to check the air velocity property of the cooling fan to determine the lengths of the fins, and thus design of the fin unit is not easy.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic apparatus comprises a heat-generating element mounted in the housing; a cooling fan mounted in the housing; a fin unit which is mounted in the housing and opposed to the cooling fan; and a heat transfer member which thermally connects the fin unit to the heat-generating element. The cooling fan includes a fan case which is provided with an opening portion. The fin unit includes an insertion portion which is inserted into the fan case through the opening portion. The insertion portion is provided to extend from one longitudinal end area to the other longitudinal end area of the opening portion.

According to one embodiment of the invention, a fin unit which is to be combined with a cooling fan including a fan case provided with an opening portion, comprises a fin unit main portion; and an insertion portion which projects from the fin unit main portion, and is to be inserted into the fan case through the opening portion. The insertion portion is provided to extend from one longitudinal end area to the other longitudinal end area of the opening portion.

Embodiments of the present invention are explained with reference to drawings, in which the invention is applied to portable computers.

Figure 1:
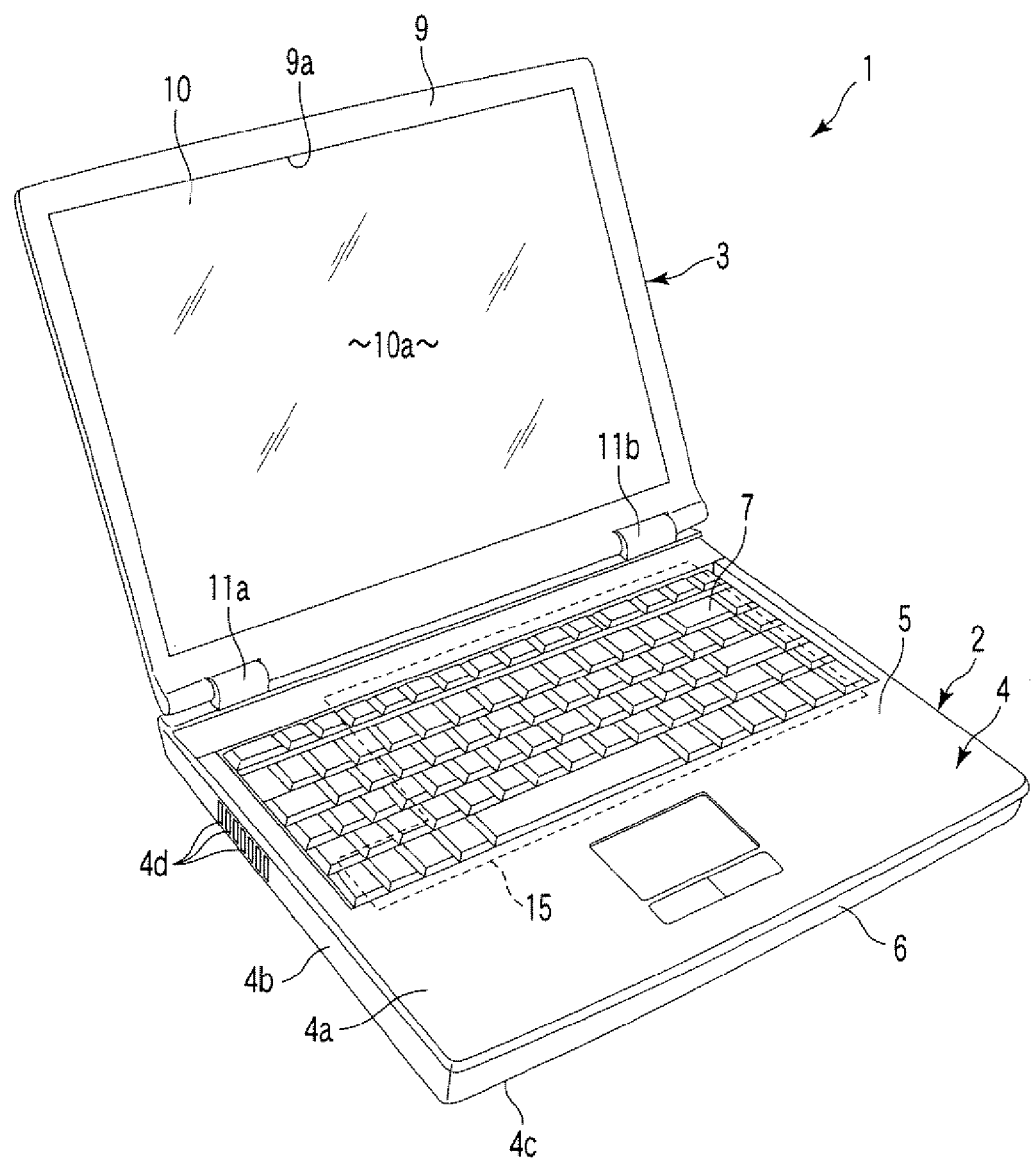
FIG. 1 is an exemplary perspective view of a portable computer according to a first embodiment of the invention.

FIGS. 1 to 6 disclose a portable computer 1 serving as an electronic apparatus according to a first embodiment of the invention. As illustrated in FIG. 1, the portable computer 1 has a main unit 2, and a display unit 3.

The main unit 2 has a housing 4 formed to have a box shape. The housing 4 has a top wall 4a, a peripheral wail 4b, and a bottom wall 4c. The housing 4 is divided into, for example, a housing cover 5 including the top wall 4a, and a housing base 6 including the bottom wall 4c. The housing cover 5 is combined with the housing base 6 from above, and detachably supported by the housing base 6. The top wall 4a supports a keyboard 7. A plurality of air outlets 4d are opened in the peripheral wall 4b.

The display unit 3 has a display housing 9, and a liquid crystal display module 10 contained in the display housing 9. The liquid crystal display module 10 has a display screen 10a. The display screen 10a is exposed to the outside of the display housing 9 through an opening portion 9a on a front surface of the display housing 9.

The display unit 3 is supported on a rear end portion of the housing 4 by a pair of hinge portions 11a and 11b. Therefore, the display unit 3 is rotatable between a closed position, in which the display unit 3 is laid down to cover the top wall 4a from above, and an open position in which the display unit 3 stands to expose the top wall 4a.

Figure 2:
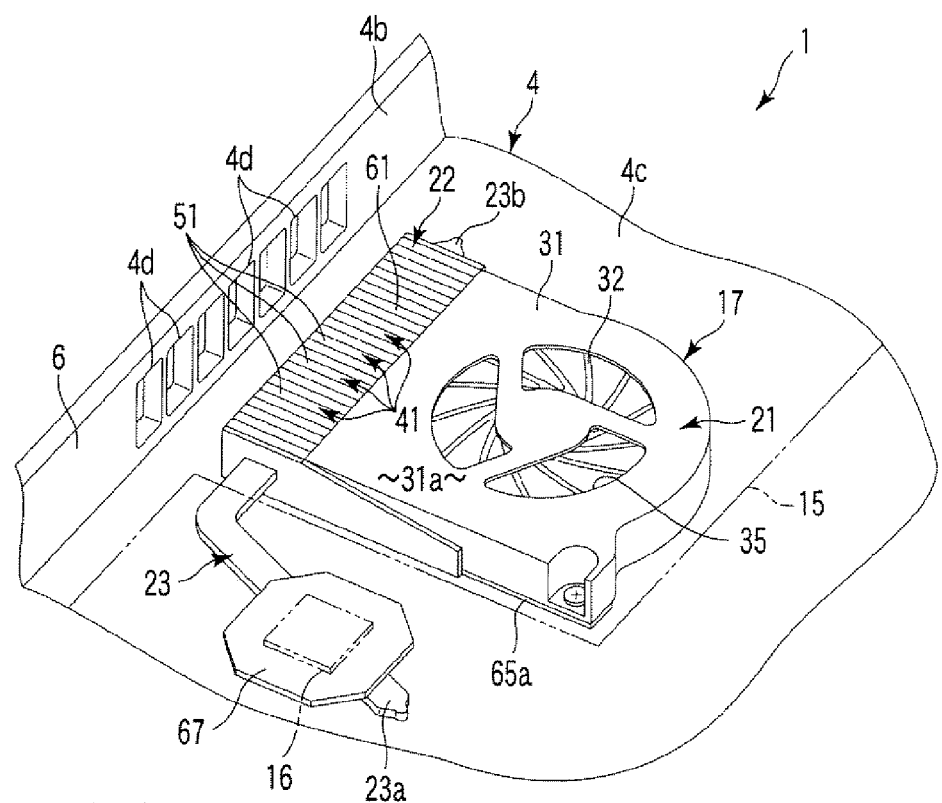
FIG. 2 is an exemplary perspective view of a cooling unit according to the first embodiment.

As illustrated in FIG. 2, the housing 4 of the main unit 2 contains a printed circuit board 15, a heat-generating element 16, and a cooling unit 17. The heat-generating element 16 is mounted on the printed circuit board 15. Examples of the heat-generating element 16 are a CPU, a graphics chip, a north bridge, and a memory, etc. The heat-generating element to which the present invention can be applied is not limited to the above examples, and corresponds to various circuit components, heat of which is required to be radiated.

The cooling unit 17 includes a cooling fan 21, a fin unit 22, and a heat transfer member 23. The cooling fan 21 is mounted in an edge region in the housing 4, in which the air outlets 4d are provided. The cooling fan 21 has a fan case 31 formed in a box shape, and a impeller 32 which is driven to be rotated in the fan case 31. An air intake 35 is provided in, for example, a top face 31a of the fan case 31. An air outlet 36 is provided in one side face 31b of the fan case 31. The air outlet 36 is an example of an opening portion of the present invention.

Figure 4:
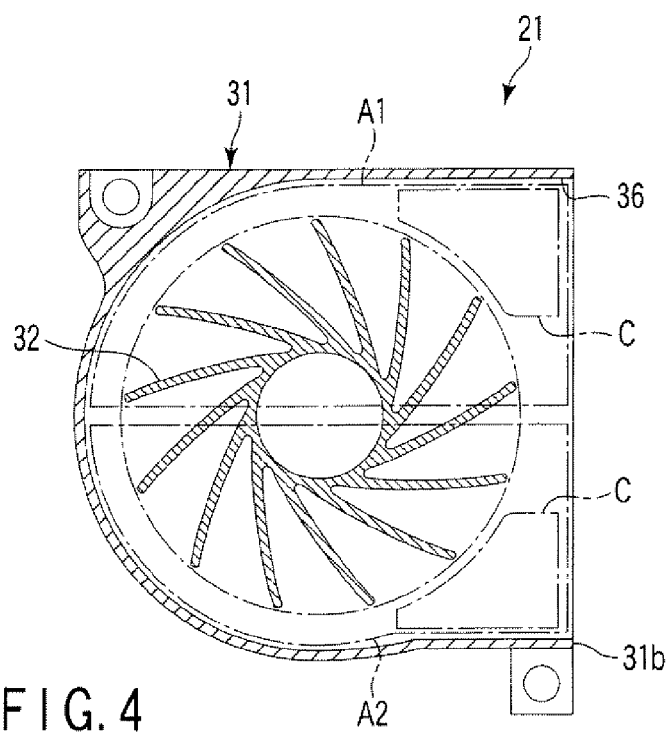
FIG. 4 is an exemplary cross-sectional view of a cooling fan according to the first embodiment.
Figure 3:
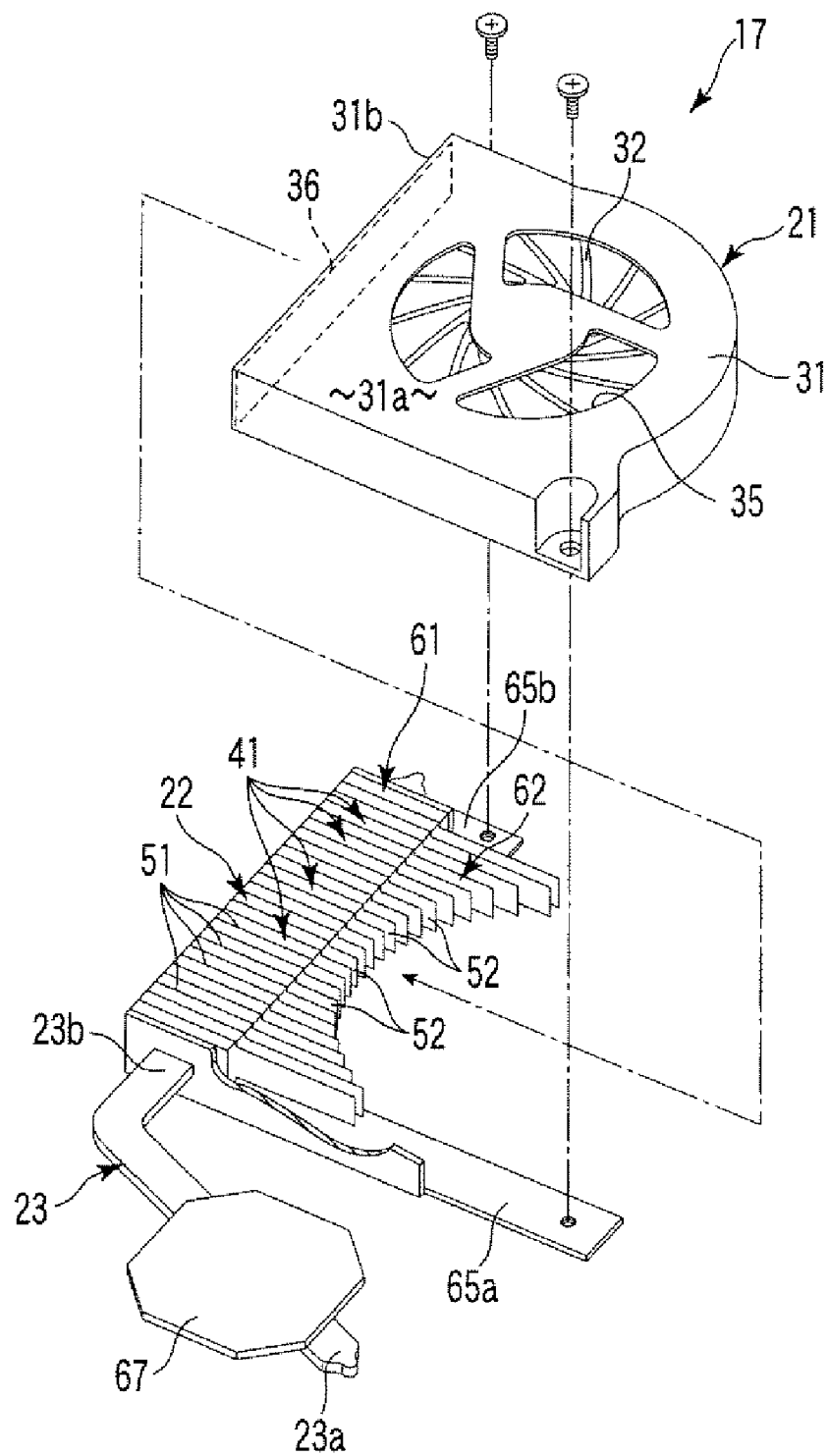
FIG. 3 is an exemplary exploded perspective view of the cooling unit according to the first embodiment.

As illustrated in FIGS. 3 and 4, the air outlet 36 is opened through almost the all area of the side face 31b of the fan case 31. More specifically, the air outlet 36 is widely formed to extend from one longitudinal end portion to the other longitudinal end portion of the rectangular side face 31b, and has a rectangular opening. As illustrated in FIG. 4, the impeller 32 is disposed in a recessed position in the fan case 31. A space is provided between the impeller 32 and the air outlet 36. Further, corner portions C are provided in edge portions of the fan case 31 adjacent to the air outlet 36. The corner portions C are formed in the regions located outside the impeller 32.

As illustrated in FIG. 4, the internal space of the fan case 31 includes a first area A1, in which the tips of the impeller 32 move in the direction of approaching the air outlet 36 when the impeller 32 is driven, and a second area A2, in which the tips of the impeller 32 move in the direction of going away from the air outlet 36. The air outlet 36 is opened to extend from the first area A1 to the second area A2, As illustrated in FIG. 2, the fin unit 22 is mounted in the housing 4 to be opposed to the cooling fan 21, and is combined with the cooling fan 21. The fin unit 22 is formed as a separate body from the cooling fan 21, and is a unit independent of the cooling fan 21. The fin unit 22 has a plurality of fins 41. The fins 41 are formed of a material having high heat conductivity, such as an aluminum alloy. The fin unit 22 is formed by arranging a plurality of fins 41 in line at intervals.

Figure 6:
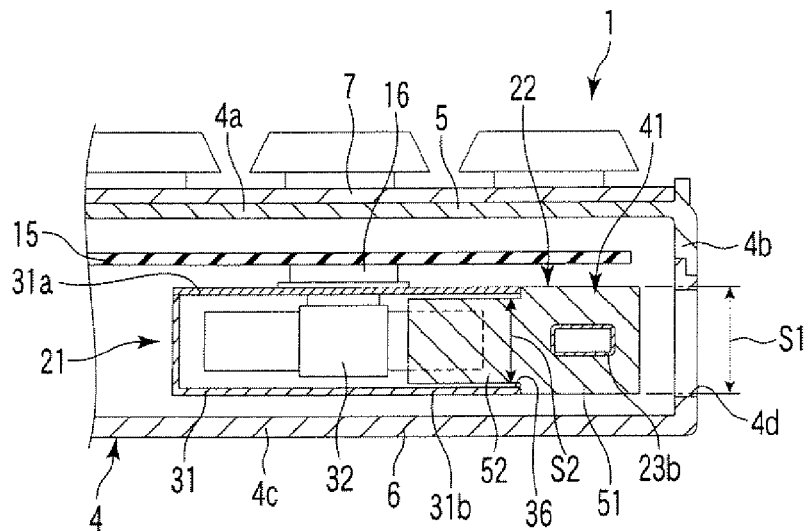
FIG. 6 is an exemplary cross-sectional view of the portable computer taken along line F6-F6 of FIG. 5.

As illustrated in FIGS. 3 and 6, each fin 41 is formed in a convex shape. Specifically, each fin 41 has a first portion 51 which is pierced by the heat transfer member 23, and a second portion 52 which projects from the first portion 51 toward the cooling fan 21. A vertical length S1 of the first portion 51 is set longer than the vertical length of the air outlet 36 of the cooling fan 21. A vertical length S2 of the second portion 52 is set smaller than the vertical length of the air outlet 36. Specifically, the vertical length S2 of the second portion 52 is smaller than the vertical length S1 of the first portion 51.

A top end portion and a bottom end portion of each first portion 51 are bent toward the longitudinal direction of the fin unit 22. The tip of the bent top end portion and the tip of the bent bottom end portion contact an adjacent fin 41, and thereby a space is secured between one fin 41 and the adjacent fin 41.

The fins 41 having the above structure form the fin unit 22 in cooperation, and thereby the fin unit 22 has a fin unit main portion 61 and an insertion portion 62 (see FIG. 3). The fin unit main portion 61 is formed by the first portions 51 of the fins 41 cooperating with one another. The insertion portion 62 is formed by the second portions 52 of the fins 41 cooperating with one another.

Figure 5:
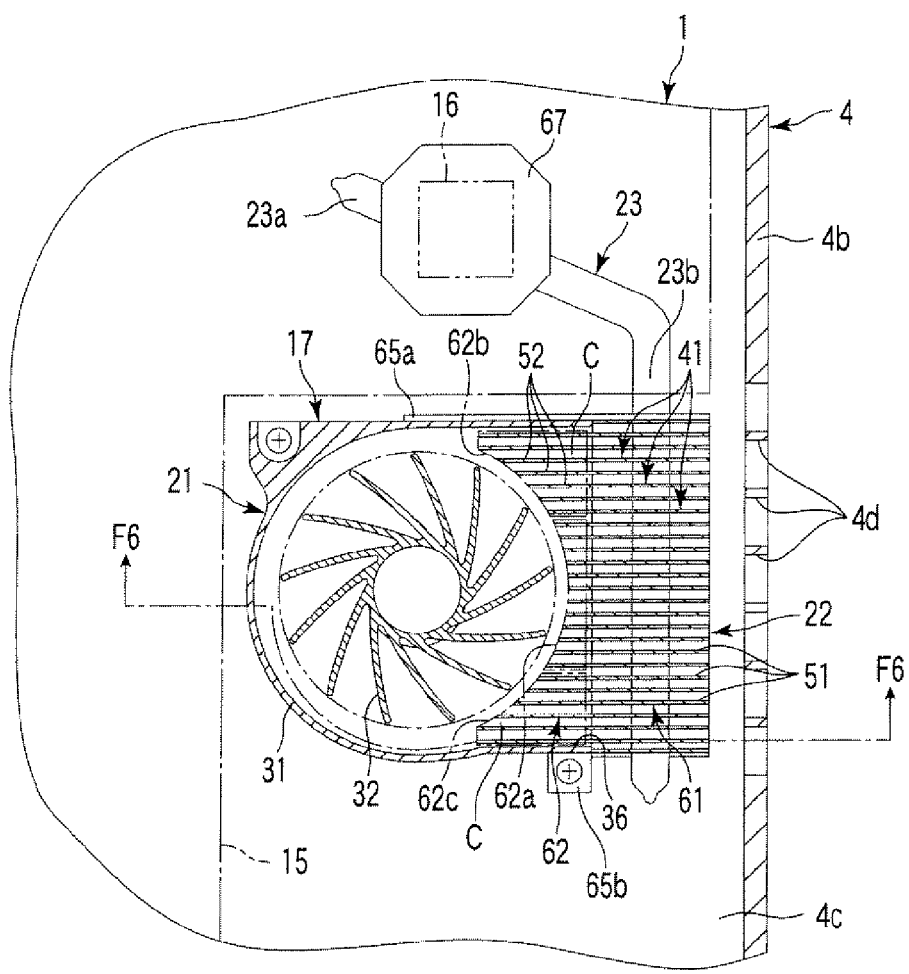
FIG. 5 is an exemplary cross-sectional view of the portable computer according to the first embodiment.

The fin unit main portion 61 is disposed outside the fan case 31. As illustrated in FIGS. 5 and 6, the fin unit main portion 61 has almost the same width as the width of the cooling fan 21, and almost the same vertical length with the vertical length of the cooling fan 21. Specifically, the fin unit main portion 61 is formed larger than the air outlet 36. In other words, a portion of the fin unit 22 other than the insertion portion 62 has an outer shape larger than an outer shape of the air outlet 36.

As illustrated in FIGS. 5 and 6, the insertion portion 62 projects from the fin unit main portion 61 toward the cooling fan 21. The insertion portion 62 is inserted into the fan case 31 through the air outlet 36. More specifically, the insertion portion 62 is inserted into an area of the fan case 31 located outside the impeller 32 (that is, an area in which the insertion portion 62 does not interfere with the impeller 32).

As illustrated in FIG. 5, the insertion portion 62 is provided to extend from one longitudinal end area to the other longitudinal end area of the air outlet 36. Specifically, the insertion portion 62 is inserted into both the first area A1 and the second area A2 of the fan case 31.

The insertion portion 62 includes a first portion 62a and second portions 62b and 62c. The first portion 62a is inserted in the space formed between the air outlet 36 and the impeller 32, and opposed to a central portion of the impeller 32. The two second portions 62b and 62c are provided separately on both sides of the first portion 62a, to hold the first portion 62a therebetween. The second portions 62b and 62c projects to the respective corner portions C (see FIG. 4) of the fan case 31, and are opposed to outer edge portions of the impeller 32. The second portions 62b and 62c are inserted more deeply into the fan case 31 than the first portion 62a.

The second portions 52 of the fins 41 have varied lengths along the circumference of the impeller 32, such that tips of the second portions 52 are disposed at a certain distance from the impeller 32. Therefore, a part of the impeller 32 is formed to have an arc shape which is along the circumference of the impeller 32. The distance between the circumference of the impeller 32 and the end portion of the insertion portion 62 is at least a distance at which the insertion portion 62 does not affect drive of the impeller 32.

A pair of holders 65a and 65b are provided on both sides of the fin unit 22. The cooling fan 21 is fixed onto the holders 65a and 65b, and thereby the fin unit 22 and the cooling fan 21 are fixed.

An example of the heat transfer member 23 is a heat pipe. The heat transfer member 23 has a heat-receiving end portion 23a and a heat-radiating end portion 23b. As illustrated in FIG. 5, the heat-radiating end portion 23b is provided to pierce through the fins 41 of the fin unit 22, and is thermally connected to the fin unit 22. The heat-receiving end portion 23a is thermally connected to the heat-generating element 16 through a heat-receiving plate 67. Thereby, the heat transfer member 23 thermally connects the fin unit 22 to the heat-generating element 16.

Next, operation of the portable computer 1 is explained.

When the portable computer 1 is used, the heat-generating element 16 generates heat. Most of the heat generated by the heat-generating element 16 is transferred to the fin unit 22 through the heat transfer member 23. The heat transferred to the fin unit 22 is diffused in the first portions 51 and the second portions 52 of the fins 41.

When the impeller 32 of the cooling fan 21 is driven to be rotated, the cooling fan 21 takes in the air in the housing 4 through the air intake 35, and discharges the taken air from the air outlet 36 toward the fin unit 22. The discharged air removes heat from the first and second portions 51 and 52 of the fins 41, and the heat is discharged to the outside of the housing 4. This promotes cooling of the heat-generating element 16.

According to the portable computer 1 having the above structure, the cooling performance may be improved. Specifically, the fin unit 22 according to the first embodiment has the insertion portion 62 in addition to the fin unit main portion 61. This means that a larger fin area is secured by the insertion portion 62. A larger fin area improves the cooling efficiency (that is, cooling performance) of the fin unit 22, and thus the cooling performance of the portable computer 1 is improved.

According to the fin unit 22 of the first embodiment, a larger fin area is secured by effectively using idle spaces in the fan case 31. Therefore, increasing the fin area does not increase the whole size of the cooling unit 17. This contributes to reduction in size of the portable computer. In other words, according to the above fin unit 22, part of the fin unit 22 is formed also in the fan case 31, and thereby increase in the fin area is achieved in a predetermined and limited mounting volume.

Further, from another point of view, according to the structure of the first embodiment, it may be said that a portable computer which achieves reduction in size can be obtained. Specifically, when a predetermined cooling performance is required, the fin area is secured by forming the insertion portion 62, and thereby a predetermined cooling performance can be secured even when the size of the fin unit main portion 61 is reduced. Therefore, the total volume of the cooling fan 21 and the fin unit 22 may be reduced. Thus, it is possible to obtain a portable computer which may achieve reduction in total size while achieving cooling performance equal to the conventional cooling unit.

The shape of the fin unit 22 of the first embodiment does not depend on the air velocity property of the cooling fan 21, but is only influenced by the shape of the air outlet 36 of the cooling fan 21 and the circumference of the impeller 32. Specifically, the fin unit 22 is applicable to cooling fans 21 of different types without any change, as long as the air outlets 36 of the cooling fans 21 have the same shape and the impellers 32 thereof have the same circumference. Therefore, it can be said that the fin unit 22 is adaptable to a wide variety of uses. The shape of the fin unit 22 of the embodiment does not depend on the air velocity property of the cooling fan 21, but is only influenced by the shape of the air outlet 36 of the cooling fan 21 and the circumference of the impeller 32. Therefore, the fin unit 22 can be designed without checking the air velocity property of the cooling fan 21, as long as the dimensions of the above components are determined. Therefore, sizes of components of the fin unit 22 can be easily designed.

When the cooling fan 21 and the fin unit 22 are provided as separate units, discharged air of the cooling fan 21 may leak from the gap between the cooling fan 21 and the fin unit 22. According to the fin unit 22 of the first embodiment, the insertion portion 62 operates to suppress leak of the discharged air of the cooling fan 21, and thus the discharged air efficiently flows from the cooling fan 21 to the fin unit 22. Thereby, the cooling efficiency of the fin unit 22 is enhanced.

Since the insertion portion 62 is provided from one longitudinal end area of the other longitudinal end area of the air outlet 36, a large fin area can be secured for the insertion portion 62. This contributes to increase in cooling performance of the portable computer 1.

Since the fin unit main portion 61 has a larger outer shape than that of the air outlet 36, the discharged air from the cooling fan 21 does not easily leak from the space between the fin unit 22 and the cooling fan 21. In particular, since the top end portions and the bottom end portions of the fins 41 are bent toward the longitudinal direction of the fin unit 22, the discharged air does not easily leak from the space between the fin unit 22 and the cooling fan 21. This contributes to increase in cooling performance of the portable computer 1.

Since the fin unit main portion 61 has a larger outer shape than that of the air outlet 36, the insertion portion 62 is prevented from being put into the fan case more deeply than necessary. This can prevent the insertion portion 62 from interfering with the impeller 32.

Large spaces are idle in the corner portions C which are located on both sides of the impeller 32 in the fan case 31. Since there are the second portions 62b and 62c inserted into the corner portions C, the spaces of the corner portions C in the fan case 31 are effectively used, and a larger fin area can be secured. This contributes to increase in cooling performance of the portable computer 1.

Since at least a part of the insertion portion 62 is formed in an arc shape which is along the circumference of the impeller 32, the end portion of the insertion portion 62 can be brought closest to the impeller 32, while the insertion portion 62 is prevented from interfering with the impeller 32. In other words, it is possible to minimize the gap between the circumference of the impeller 32 and the insertion portion 62 of the fin unit 22.

Therefore, it is possible to maximize the fin area of the fin unit 22 within a predetermined mounting restriction. This contributes to increase in cooling performance of the portable computer 1. All parts of the fin unit 22 are not necessarily formed in an arc shape, although they may be formed in an arc shape. Forming at least a part of the fin unit 22 in an arc shape can reduce the gap between the insertion portion 62 and the impeller 32.

Next, a portable computer 71 serving as an electronic apparatus according to the second embodiment of the present invention is explained with reference to FIG. 7. Constituent elements which have the same functions as those of the portable computer 1 of the first embodiment are denoted by the same respective reference numbers, and explanation thereof is omitted.

Figure 7:
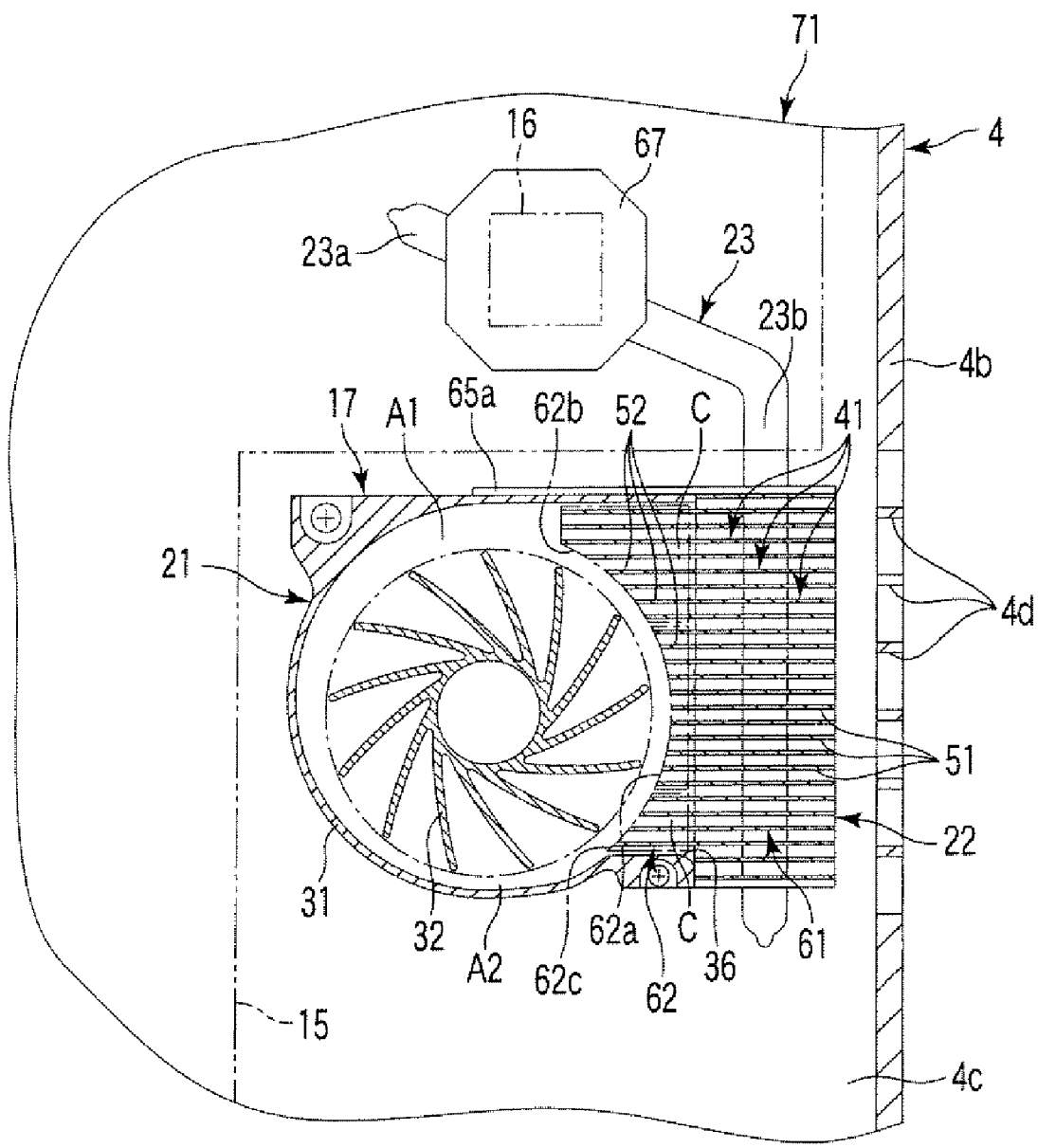
FIG. 7 is an exemplary cross-sectional view of a portable computer according to a second embodiment of the invention.

As illustrated in FIG. 7, the center of an impeller 32 of a cooling fan 21 according to the second embodiment is eccentric from the center of an air outlet 36 along the longitudinal direction of the air outlet 36. The fin unit 22 has a fin unit main portion 61 and an insertion portion 62. The insertion portion 62 according to the second embodiment is provided to extend from one longitudinal end area to the other end area of the air outlet 36.

Second portions 52 of fins 41 have varied lengths along the circumference of the impeller 32, such that tips of the fins 41 are located at a certain distance from the impeller 32. Therefore, part of the end portion of the insertion portion 62 is formed in an arc shape which is along the circumference of the impeller 32.

The structures of the fin unit 22 and the portable computer 71 other than the parts explained above are the same as those of the fin unit 22 and the portable computer 1 of the first embodiment.

According to the portable computer 7l, the cooling performance is also improved as in the first embodiment.

Next, a portable computer 81 serving as an electronic apparatus according to a third embodiment of the present invention is explained with reference to FIG. 8. Constituent elements which have the same functions as those of the portable computers 1 and 71 of the first and the second embodiments are denoted by the same respective reference numbers, and explanation thereof is omitted.

Figure 8:
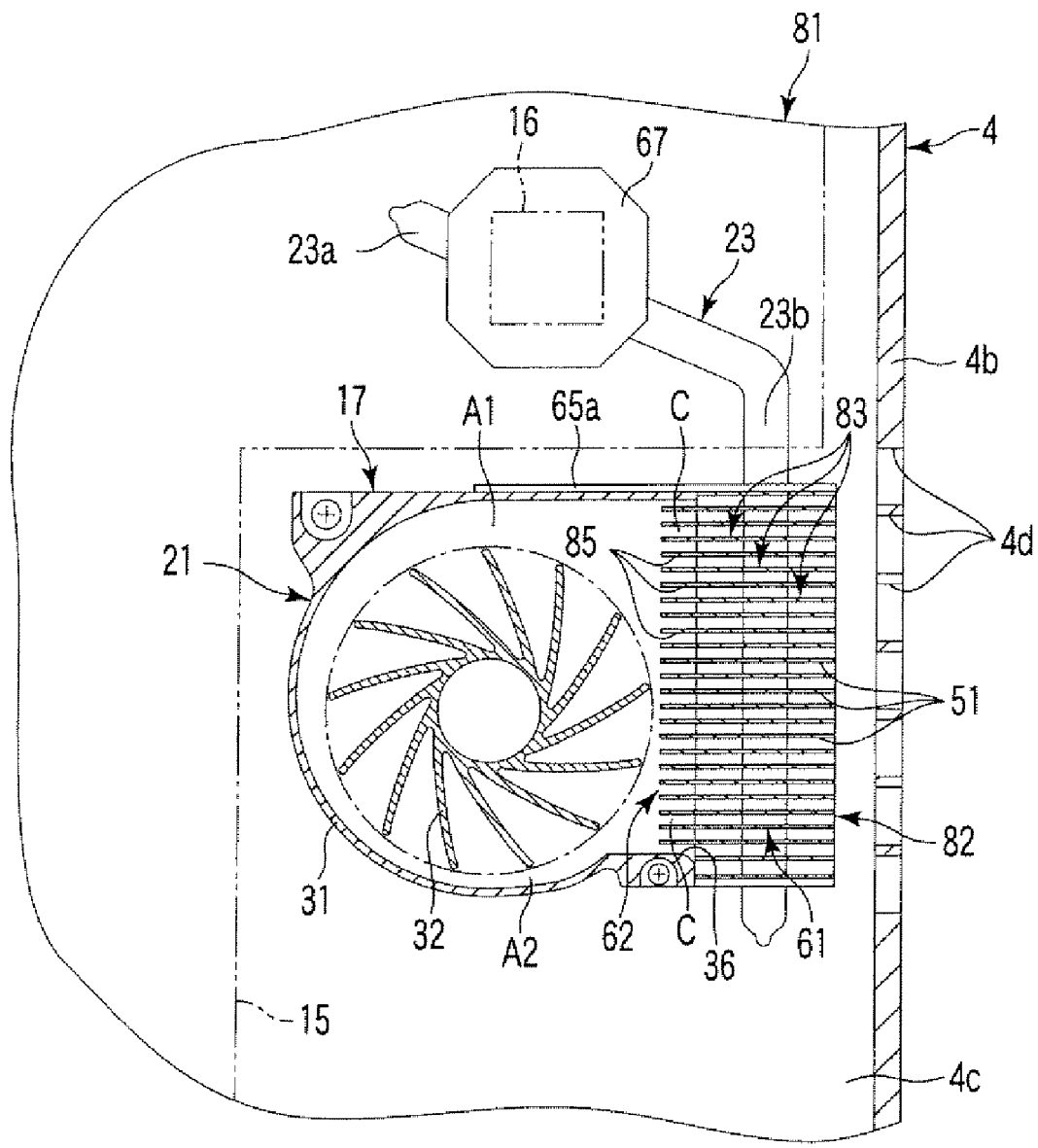
FIG. 8 is an exemplary cross-sectional view of a portable computer according to a third embodiment of the invention.

As illustrated in FIG. 8, a fin unit 82 of the portable computer 81 is formed by arranging a plurality of fins 83 in line at intervals between them. As illustrated in FIG. 8, each fin 83 has a first portion 51 which is pierced by a heat transfer member 23, and a second portion 85 which extends from the first portion 51 toward a cooling fan 21. The second portions 85 of all the fins 83 according to the third embodiment have the same length.

The structures of the fin unit 82 and the portable computer 81 other than the parts explained above are the same as those of the fin unit 22 and the portable computer 1 of the first embodiment.

The portable computer 81 having the above structure has an improved cooling performance. Specifically, the fin unit 82 according to the third embodiment has the insertion portion 62 in addition to the fin unit main portion 61, and a large fin area is secured. Thereby, the cooling performance of the fin unit 82 is improved, and the cooling performance of the portable computer 81 is improved.

Since all the fins 83 have the same length, the portable computer 81 has improved manufacturability. Further, since the fins 83 are standardized, the manufacturing cost is reduced.

As a matter of course, the present invention is not limited to the portable computers 1, 71, and 81 according to the first to third embodiment explained above. Constituent elements of the above embodiments can be used in combination as required.

The opening portion of the cooling fan 21, through which the fin unit 22 or 82 is inserted, is not limited to the air outlet 36, but may be an air intake. For example, in cooling fans of a type in which an air intake is opened in one side face of the fan case 31, the insertion portion 62 of the fin unit 22 or 72 may be inserted through the air intake. Since an air vent is used as the opening portion through which the fin unit 22 or 72 is inserted, it is unnecessary to provide a special opening portion in the fan case 31. The term "air vent" in the specification includes an air outlet and an air intake.

The parts (that is, the fin unit main portion 61) of the fin unit 22 and 72 which are other than the insertion portion 62 are not necessarily larger than the outer shape of the air outlet 36. Although the cooling performance is improved even when the insertion portion 62 is provided to extend over a part of the air outlet 36, the cooling performance is further improved when the insertion portion 62 is provided to extend from one end area to the other end area of the air outlet 36.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing;
   a heat-generating element in the housing;
   a cooling fan in the housing, the cooling fan comprising a fan case comprising an opening portion;
   a fin unit in the housing facing the cooling fan; and
   a heat transfer member thermally connecting the fin unit to the heat-generating element,
   wherein the fin unit comprises an insertion portion inserted into the fan case through the opening portion, the insertion portion extending from one longitudinal end area to the other longitudinal end area of the opening portion, and the fin unit is provided with a holder holding the cooling fan.

2. The electronic apparatus of claim 1, wherein the fin unit is provided with a second holder holding the cooling fan.

3. The electronic apparatus of claim 2, wherein the holder is provided at a first end portion of the fin unit in a longitudinal direction of the fin unit, and the second holder is provided at a second end portion of the fin unit which is located opposite to the first end portion in the longitudinal direction.

4. The electronic apparatus of claim 3, wherein:
   the cooling fan comprises a first end portion in a longitudinal direction of the opening portion and a second end portion located opposite to the first end portion of the cooling fan in the longitudinal direction of the opening portion; and
   the holder holds the first end portion of the cooling fan, and the second holder holds the second end portion of the cooling fan.

5. The electronic apparatus of claim 3, wherein the holder holds a first end part of the cooling fan where the opening portion is provided, and the second holder holds a second end part of the cooling fan which is located opposite to the first end part in a direction from the fin unit toward the cooling fan.

6. The electronic apparatus of claim 3, wherein the holder holds a first corner portion of the cooling fan, and the second holder holds a second corner portion of the cooling fan which is diagonally opposed to the first corner portion.

7. The electronic apparatus of claim 1, wherein the fin unit comprises a fin unit main portion located outside the fan case, and the fin unit main portion has a height greater than that of the opening portion.

8. The electronic apparatus of claim 1, wherein:
   the cooling fan comprises an impeller configured to be driven in the fan case, and
   the insertion portion comprises a first portion opposed to a central portion of the impeller, and second portions provided on both sides of the first portion of the insertion portion and opposed to outer edge portions of the impeller, the second portions of the insertion portion being inserted into the fan case more deeply than the first portion of the insertion portion.

9. An electronic apparatus of claim 1, wherein
   the cooling fan comprises an impeller configured to be driven in the fan case, and, at least part of the insertion portion is formed in an arc shape along a circumference of the impeller.

10. A fin unit configured to be combined with a cooling fan, the cooling fan comprising a fan case provided with an opening portion, the fin unit comprising:
    a fin unit main portion; and
    an insertion portion projecting from the fin unit main portion, the insertion portion being configured to be inserted into the fan case through the opening portion and to extend from one longitudinal end area to the other longitudinal end area of the opening portion,
    the fin unit being provided with a holder configured to hold the cooling fan.

11. The fin unit of claim 10, wherein the fin unit is provided with a second holder configured to hold the cooling fan.

12. The fin unit of claim 11, wherein the holder is provided at a first end portion of the fin unit in a longitudinal direction of the fin unit, and the second holder is provided at a second end portion of the fin unit which is located opposite to the first end portion in the longitudinal direction.

13. An electronic apparatus comprising:
    a housing;
    a heat-generating element in the housing;
    a cooling fan in the housing, the cooling fan comprising a fan case comprising an opening portion;
    a fin unit in the housing facing the cooling fan; and a heat transfer member thermally connecting the fin unit to the heat-generating element, wherein the fin unit comprises:
- an insertion portion inserted into the fan case through the opening portion, and
- a plurality of fins, each of the fins comprising a first portion located outside the cooling fan and a second portion forming a part of the insertion portion, the first portion of each of the fins comprising a top end portion and a bottom end portion which are bent in a longitudinal direction of the fin unit to contact an adjacent one of the fins.

14. The electronic apparatus of claim 13, wherein the top end portions are located above an upper edge of the opening portion of the cooling fan, and the bottom end portions are located below a lower edge of the opening portion of the cooling fan.

15. The electronic apparatus of claim 13, wherein the top end portions and the bottom end portions close gaps between those of the fins, which are located outside the cooling fan, from above and below.

16. The electronic apparatus of claim 13, wherein
the fin unit comprises a fin unit main portion located outside the fan case, and the fin unit main portion has a height greater than that of the opening portion.

* * * * *